(12) United States Patent
Angelini et al.

(10) Patent No.: US 11,366,140 B2
(45) Date of Patent: Jun. 21, 2022

(54) SENSING CIRCUIT, CORRESPONDING DEVICE AND METHOD

(71) Applicant: STMicroelectronics S.r.l., Agrate Brianza (IT)

(72) Inventors: Paolo Angelini, Bologna (IT); Roberto Pio Baorda, Casarile (IT); Francesco Borgioli, Leghorn (IT); Marco Garbarino, Cusago (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 32 days.

(21) Appl. No.: 17/102,037

(22) Filed: Nov. 23, 2020

(65) Prior Publication Data

US 2021/0165023 A1 Jun. 3, 2021

(30) Foreign Application Priority Data

Nov. 29, 2019 (IT) ................. 102019000022533

(51) Int. Cl.
*G01R 19/00* (2006.01)
*H02J 50/12* (2016.01)
(Continued)

(52) U.S. Cl.
CPC ......... *G01R 19/0092* (2013.01); *G01R 1/203* (2013.01); *G01R 19/16533* (2013.01); *H02J 50/12* (2016.02); *H03F 2200/481* (2013.01)

(58) Field of Classification Search
CPC .......... G01R 19/0092; G01R 19/16533; G01R 1/203; H02J 50/12
See application file for complete search history.

(56) References Cited

U.S. PATENT DOCUMENTS

| | | | |
|---|---|---|---|
| 3,890,841 A | 6/1975 | Brixy | |
| 5,469,071 A | 11/1995 | Obata | |

(Continued)

FOREIGN PATENT DOCUMENTS

| | | |
|---|---|---|
| EP | 0748451 A1 | 12/1996 |
| EP | 2784521 A1 | 10/2014 |
| JP | 2003066074 A | 3/2003 |

OTHER PUBLICATIONS

Lin, Jianbin et al., "A High-Side Current Sensing Circuit with High PSRR Based on BCD Process", IEEE International Conference on Anti-Counterfeiting, Security and Identification, Jun. 24-26, 2011, 3 pages.

(Continued)

*Primary Examiner* — Dominic E Hawkins
(74) *Attorney, Agent, or Firm* — Slater Matsil, LLP

(57) ABSTRACT

A current measurement circuit, for wireless charging systems, for instance, comprises a differential input configured to have applied an input voltage sensed across a shunt resistor traversed by a current to be measured, a voltage reversal switch arrangement selectively switchable to reverse the polarity of the input voltage as applied between a first and a second voltage sensing nodes as well as a first and a second current flow line between the voltage sensing nodes and ground. A difference resistor intermediate the two current flow lines is traversed by a current which is a function of the input voltage as applied to the first and second sensing nodes via the voltage reversal switch arrangement. First and second current sensing nodes at the two current flow lines are coupled to a differential current output via a current reversal switch arrangement selectively switchable to reverse the output current polarity.

20 Claims, 3 Drawing Sheets

(51) Int. Cl.
*G01R 1/20* (2006.01)
*G01R 19/165* (2006.01)

(56) References Cited

U.S. PATENT DOCUMENTS

| | | | |
|---|---|---|---|
| 5,491,404 A | | 2/1996 | Settles et al. |
| 6,617,838 B1 * | | 9/2003 | Miranda .................. H03F 3/005 |
| | | | 327/451 |
| 7,633,317 B2 * | | 12/2009 | Miranda .................... G05F 5/00 |
| | | | 327/51 |
| 10,976,351 B2 * | | 4/2021 | Zhang ..................... G01R 17/00 |
| 2009/0128132 A1 | | 5/2009 | Wappis et al. |
| 2013/0271216 A1 | | 10/2013 | Liu et al. |
| 2018/0323607 A1 * | | 11/2018 | Cass ....................... H02H 3/087 |
| 2020/0186109 A1 * | | 6/2020 | Chao ................... H03F 3/45753 |

OTHER PUBLICATIONS

Xu, Shalmany et al., "A +/−12-A High-Side Current Sensor With 25V Input CM Range and 0.35% Gain Error From -40° C. to 85° C.", IEEE Solid-State Circuits Letters, vol. 1, No. 4, Apr. 2018, 4 pages.

* cited by examiner

SENSING CIRCUIT, CORRESPONDING DEVICE AND METHOD

CROSS-REFERENCE TO RELATED APPLICATIONS

This application claims the benefit of Italian Application No. 102019000022533, filed on Nov. 29, 2019, which application is hereby incorporated herein by reference.

TECHNICAL FIELD

The description relates to sensing circuits.

One or more embodiments may be applied, for instance, in current sensing in wireless charging arrangements.

BACKGROUND

Accurate measurement in wireless charging arrangements is a desirable feature both on the transmitter side and on the receiver side.

Together with voltage measurement, current measurement provides an indication of the power transmitted or received within a system.

Information on power transmitted and received may play a significant role in so far as, for instance, a number of protocols for use in wireless charging applications may take advantage from accurate current measurement.

Current measurement techniques using a resistor as the sensing (or probe) element rely on Ohm's law, based on which the current I flowing through a resistor having a resistance value R generates a voltage $V=R*I$ at the resistor terminals. Such a voltage can be amplified and possibly converted to digital for measurement and other types of processing.

Such an approach exhibits a number of advantages such as low cost, easy integration on semiconductors such as silicon using standard processes and direct current measurement.

Such advantages are somehow mitigated by certain accuracy issues.

In fact, the result of current measurement using a shunt resistor has a linear dependency on the shunt resistance, and resistors as integrated on semiconductors (silicon, for instance) using standard processes may give rise to accuracy issues for at least three reasons:
process spread during semiconductor diffusion,
thermal drift,
sensitivity to mechanical stresses and aging.

The first two issues may be addressed by resorting to calibration and various circuit arrangements for thermal drift compensation. The last issue may turn out to be critical with an ensuing risk of placing constraints on the degree of accuracy which can be achieved.

Additionally, those current measurement arrangements based on an H-bridge (Wheatstone bridge) supplied with a high voltage (which is a possible occurrence in wireless charging transmitters) may take advantage from placing the shunt resistor in series to the supply path of the bridge.

This may give rise to a common mode component in the voltage across the resistor near the bridge supply which may reach values as high as tens of Volts.

Additionally, an H-bridge configuration is frequently used in a switching arrangement. The resulting signals may have non-negligible spectral contents for frequencies up to tens of MHz even though the information of interest is primarily related to the average value of the current absorbed by a device, this being essentially a low-frequency component.

Additionally, using a small resistance value may be advantageous in order to avoid affecting the efficiency of the H-bridge; using a small resistance in turn reduces to a few mV the voltage values which can be sensed across the sensing resistor. An input stage exhibiting low-offset and low-noise may thus represent a desirable option for coupling to the sensing resistor.

SUMMARY

An object of one or more embodiments is to contribute in providing improved arrangements dispensing with the drawbacks discussed in the foregoing.

According to one or more embodiments, that object can be achieved by means of a circuit having the features set forth in the claims that follow.

One or more embodiments may relate to a corresponding device.

One or more embodiments may relate to a corresponding method.

One or more embodiments may provide current sensing circuits (for use in wireless charging arrangements, for instance) exhibiting one or more of the following features:
high voltage (HV) input and low voltage (LV) output,
low pass filtering,
low offset and low noise,
fully differential architecture.

One or more embodiments can provide current sensing circuits exhibiting high accuracy with the capability of maintaining such accuracy over time during the whole useful life time of the related products.

BRIEF DESCRIPTION OF THE DRAWINGS

One or more embodiments will now be described, by way of example only, wherein.

DETAILED DESCRIPTION OF ILLUSTRATIVE EMBODIMENTS

Figure 1:
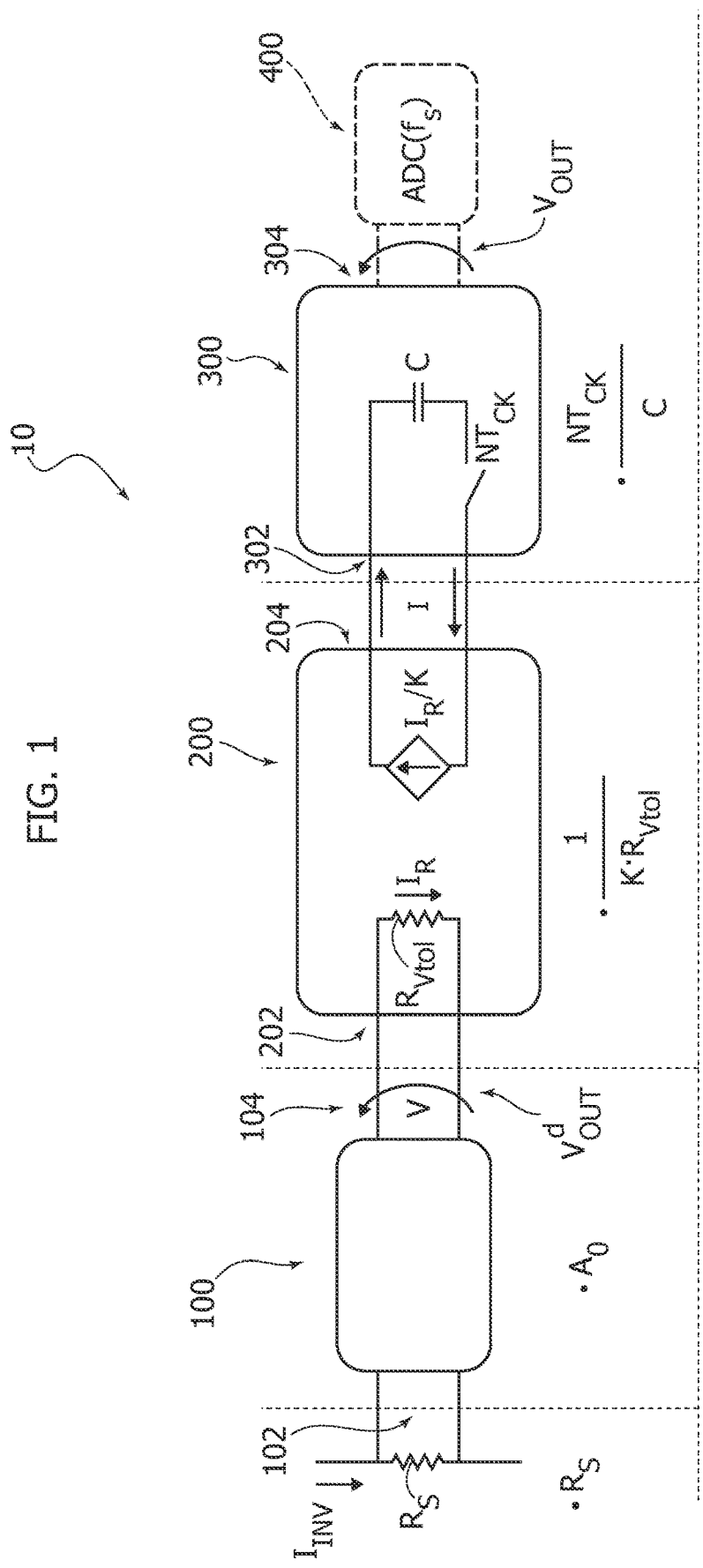
FIG. 1 is a block diagram exemplary of a current sensing device as exemplified herein.

In the following description, various specific details are given to provide a thorough understanding of various exemplary embodiments of the present specification. The embodiments may be practiced without one or several specific details, or with other methods, components, materials, etc. In other instances, well-known structures, materials, or operations are not shown or described in detail in order to avoid obscuring various aspects of the embodiments. Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings provided herein are for convenience only, and therefore do not interpret the extent of protection or scope of the embodiments.

By way of general introduction to a detailed description of illustrative embodiments, certain prior art solutions will be briefly discussed.

For instance L. Xu, et al.: "A+/−12-A High-Side Current Sensor With 25V Input CM Range and 0.35% Gain Error From—40° to 85°", IEEE Solid-State Circuits Letters, Vol. 1, No. 4, April 2018 discloses a current sensing system based on a shunt resistor including a "high side" integrated shunt which is compatible with a high common mode input voltage. An input chopping system is also disclosed which facilitates providing a low-noise and low-offset input stage. Direct conversion to digital of the voltage across the shunt is provided which makes measurement directly sensitive to possible variations of the shunt resistor as discussed previously. Direct sampling of the output signal is suggested without an anti-aliasing filter. This militates against the ability to process signals having an appreciable high-frequency content: as discussed, this may be the case of H-bridge arrangements as conventional in wireless charging applications.

Document US 2009/0128132 A1 discloses an arrangement where a capacitor is used for integrating a replica of a current to be measured over a certain time and the charge thus accumulated is transferred onto a second capacitance to develop an output voltage. In that way, the output voltage is not affected by variations in a shunt resistor, which is in fact dispensed with. Such an approach exhibits various drawbacks which end up by making the final value of the current fairly inaccurate. Various factors contribute to such negative outcome, namely:

a shunt resistor is avoided and a current mirror which mirrors the current to be measured is used as a sensing element;

the transistors (mosfet transistors) in the current mirror act as high-voltage switches and are unable to provide an accurate current mirror for various reasons inherent in current mirror structure and operation;

a high offset sensitivity may be present and, additionally, the system exhibits sensitivity to the noise generated by an operational amplifier (Op-Amp) used without offset cancellation;

an essentially single-ended system is discussed which shows a reduced accuracy in the presence of various types of nuisance as possibly present on the ground and supply lines which are conventionally present in switching systems;

the system is hardly compatible with a high input voltage and involves signal sensing directly without any anti-aliasing filter: again, this militates against the ability to process signals with significant contents at high frequencies like those generated in a H-bridge as currently used in wireless charging.

J. Lin et al. "A High-Side Current Sensing Circuit With High PSRR Based on BCD Process", 2011 IEEE International Conference on Anti-Counterfeiting, Security and Identification, Xiamen, China, 24-26 Jun. 2011 disclose an arrangement involving a "high side" shunt. This arrangement suffers from a number of drawbacks:

the output voltage is a function of the resistance value of the sensing resistor and is intrinsically limited by the accuracy in such resistance value as discussed in the introductory portion of this description;

a single-ended system is considered which, as already discussed, may lead to high sensitivity to nuisance on the ground and supply lines of switching systems, no offset cancellation is contemplated which renders the system sensitive to offset (and to Op-Amp noise, also), no low-pass filtering of the output signal is contemplated.

FIG. 1 is exemplary of a device 100 configured to be coupled to a (shunt) resistor $R_S$, with a current $I_{INV}$ traversing (this is, flowing through) the resistor $R_S$. The current $I_{INV}$ is the current whose intensity is desired to be measured.

In one or more embodiments, the (shunt) resistor $R_S$ can be arranged in series to a supply path of an H-bridge (not visible in the figures).

The resistor $R_S$ per se may be a distinct part from the embodiments. However, in one or more embodiments, the resistor $R_S$ lends itself to being integrated with an associated measuring chain as discussed in the following (and possibly an associated H-bridge).

The device 10 is configured to receive at an input 102 (which, as discussed in the following, may be a differential input) an input voltage equal to the product $I_{INV}*R_S$.

In one or more embodiments as exemplified herein, the device 10 may comprise a three-stage architecture including three stages 100, 200, 300 possibly followed by an analog-to-digital converter 400 (shown in dashed lines on the right-hand side of FIG. 1) operating at a sampling frequency $f_S$.

The first (input) stage 100 may include a circuit configured to transfer the input (voltage) signal from a first voltage domain (a high voltage, HV, domain, for instance) to a second domain (a low voltage, LV, domain, for instance) for further processing in the stages 200 and 300.

In one or more embodiments, the circuit 100 may provide a low-frequency gain $A_o$ as well as a low-pass filtering action.

In one more embodiments, the second stage 200 may comprise a voltage-to-current converter including a second resistor $R_{Vtol}$, which receives at a (differential) input 202 the (differential) voltage output at 104 from the first stage 100 and converts such a voltage into a (differential) current I at an output 204 based on a relationship of the kind I=V/(K*$R_{Vtol}$) where the factor K may be implemented via a current mirror.

In one or more embodiments, the third stage 300 may comprise a current-to-voltage converter configured to receive at an input 302 the (differential) current I at the output 204 and re-convert such an input current into a (differential) output voltage at an output 304.

In one or more embodiments, the converter 300 may include a switched-capacitor circuit wherein a capacitor C is periodically charged with the input current to the converter 300 for a certain time as set by a system clock signal (with a period Tck) and subsequently discharged.

The (differential) output voltage from the third (converter) stage 300 may thus be expressed as $V_{out}=I_{INV}*N*T_{CK}/C$ where N represents an integer number of clock pulses.

It will be otherwise appreciated that representing the device 10 as a cascaded arrangement of three stages 100, 200 and 300 wherein:

the output 104 from the first stage 100 is applied to the input 202 of the second stage 200, and the output 204 from the second stage 200 is applied to the input 302 of the third stage 300 is merely for the sake of simplicity and ease of explanation.

Those of skill in the art will thus appreciate that implementing the stages 100, 200 and 300 as distinct stages does not represent a mandatory requirement of the embodiments.

In one of more embodiments, parts or elements from each of these stages can be mutually integrated and/or arranged in a different manner, for instance with parts or elements here exemplified as included in a certain stage possibly transferred to an adjacent stage as suggested by implementation and manufacturing options.

Turning, by way of simplicity and ease of understanding, to the three-stage illustrative representation adopted herein, the output voltage $V_{OUT}$ at the output 304 (that is the output from the third stage 300, which may be regarded as the output from the device 10 as a whole) can be expressed as a function of (the intensity of) the current $I_{INV}$ to be measured by multiplying the gains of the three stages 100, 200 and 300, namely:

$$V_{OUT} = \frac{R_S}{R_{Vtol}} \frac{A_0}{K} \frac{NT_{CK}}{C} I_{INV}$$

In respect of the foregoing, one may note that:

$R_S/R_{Vtol}$ is the ratio of two resistances, $A_o$ is the gain of the first stage 100 which (as discussed in the following) may be again implemented as the ratio of two resistances, K is the mirror factor of a current mirror which can be implemented via matched transistors, $N*T_{CK}$ is a time determined by an integer number of periods of system clock signal, C is a capacitor value which can be used in the third stage 300; this may be implemented, for instance, via a metal-oxide-metal (MOM) capacitor.

The ratio of the resistances of two (homogeneous) resistors (like two resistors integrated on a same chip) can be implemented with a degree of accuracy which is (much) higher than the accuracy of a single resistor.

Likewise, gain factors such as $A_o$ and K can be implemented in accurate manner so that in an arrangement as exemplified herein the overall accuracy is essentially determined by the accuracy associated with $T_{CK}$ and C.

One or more embodiments as exemplified herein thus facilitate transferring any possible limitation in terms of accuracy to entities such as $T_{CK}$ and C. These entities lend themselves to being implemented in a (much) more accurate manner than the resistance value of an integrated resistor.

In one or more embodiments, such an advantage can be achieved while retaining the basic concept of using a shunt resistor $R_S$ as the element sensitive to the current to be measured.

In one or more embodiments, the stages 100, 200 and 300 can be implemented in a (wholly) differential manner. This facilitates achieving a good degree of immunity to common-mode nuisance sources which may be present in switching systems as conventionally used in wireless charging applications, for instance.

Figure 2:
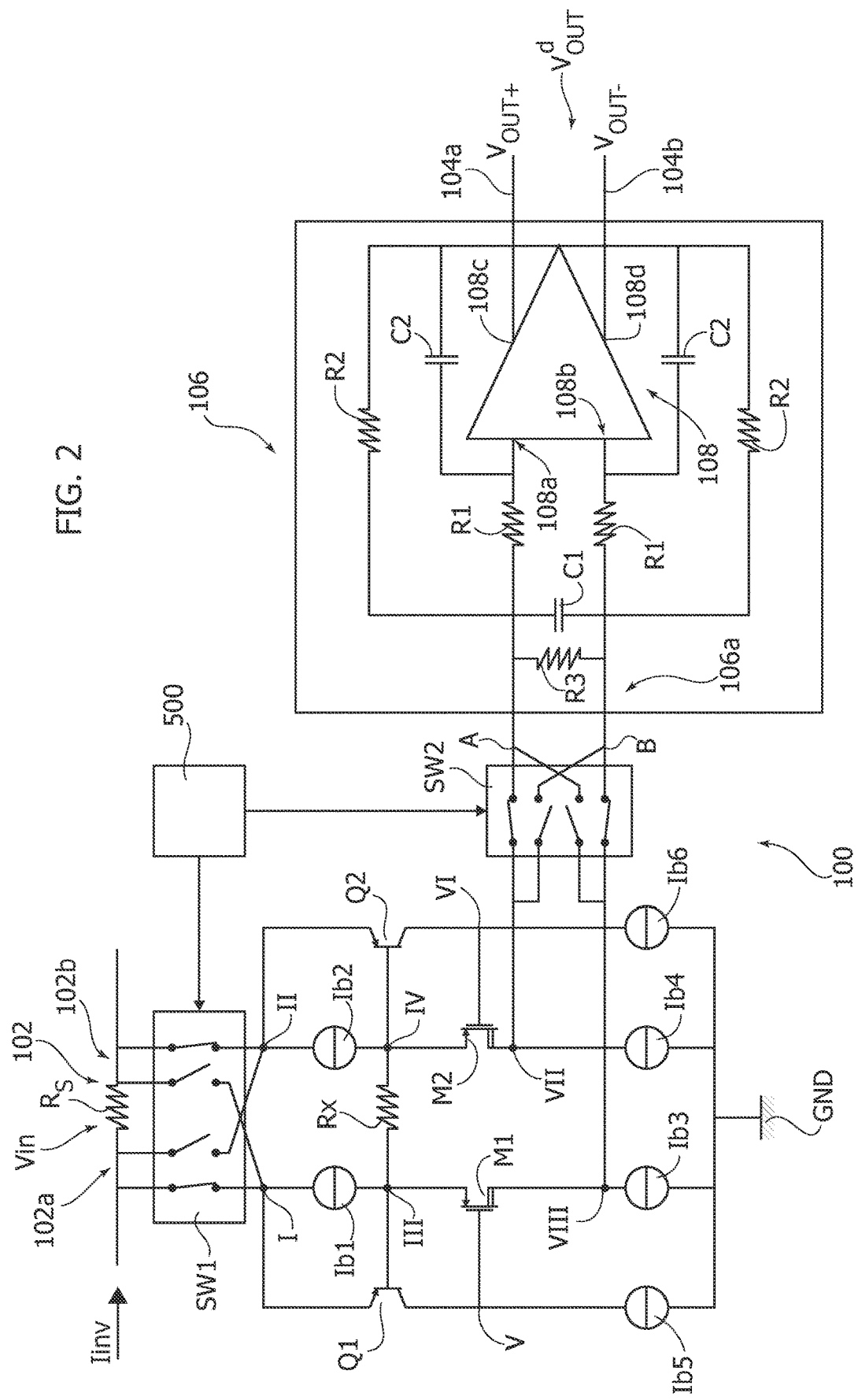
FIGS. 2 and 3 are circuit diagrams illustrative of the architecture and two possible operating conditions of a circuit which may be included in a device as exemplified in FIG. 1.
Figure 3:
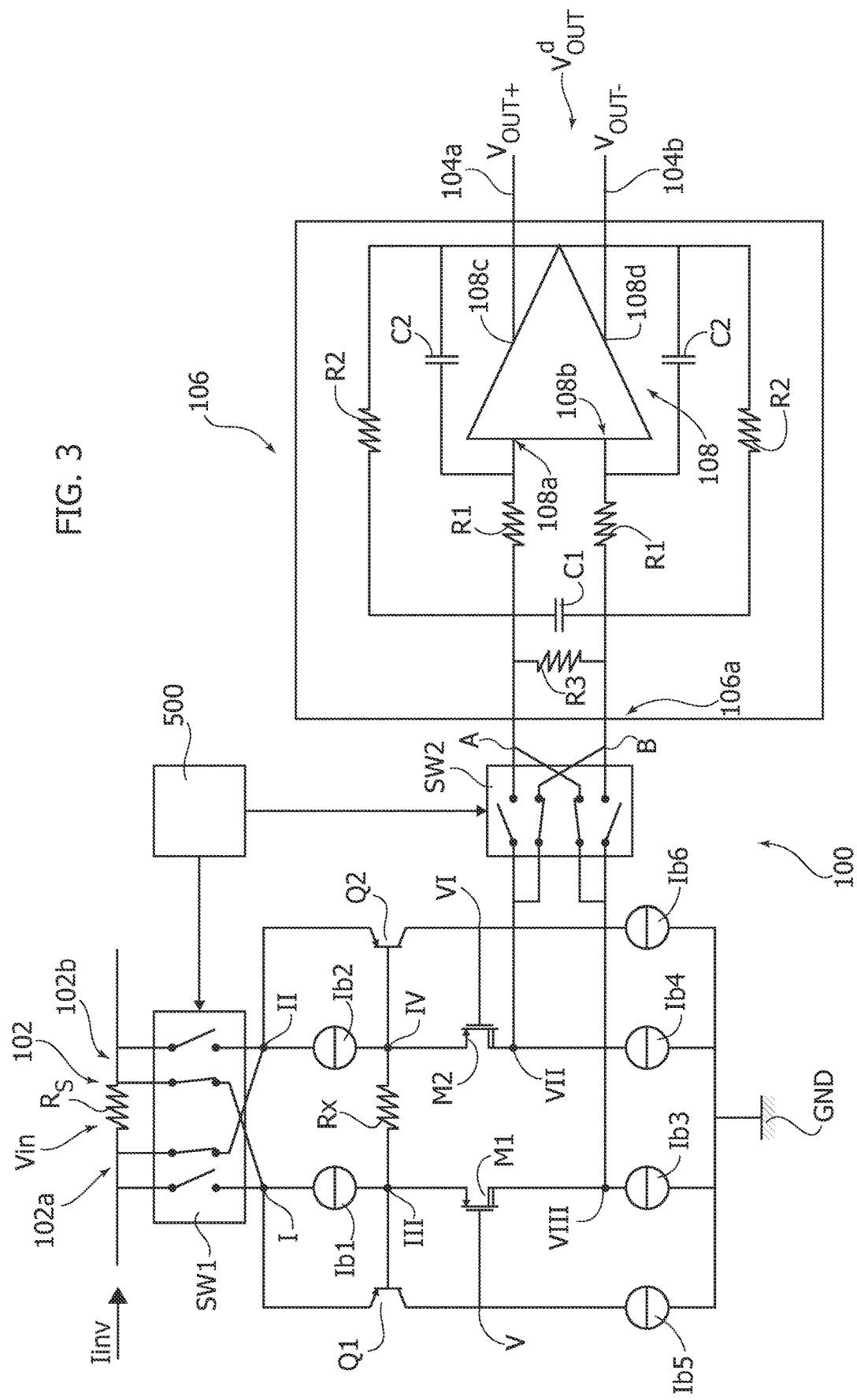

The circuit diagrams of FIGS. 2 and 3 are illustrative of possible embodiments of the first stage 100 where the designations I and II apply to two voltage sensing nodes coupled to the differential input 102 of the stage 100 via a voltage reversal switching arrangement SW1.

Designating the input 102 of the stage 100 as "differential" refers to the fact that such an input port includes two input nodes 102a, 102b configured to have the resistor $R_S$ coupled therebetween. A voltage difference equal to $I_{INV}*R_s$ can thus be applied as an input voltage between the input notes 102a, 102b.

Assuming, for instance that the current $I_{INV}$ flows through the resistor $R_S$ in a direction from the node iota to the node 102b (as represented in FIGS. 2 and 3), the node 102a will be at a higher potential than the node 102b: such an assumption is merely for explanatory purposes in so far as a complementary condition (the input node 102b at higher potential than the node iota may apply in the case the current $I_{INV}$ flows through the resistor $R_S$ in the opposite direction, that is from the node 102b towards the node iota.

In one or more embodiments, the voltage reversal switch arrangement SW1 can be configured (in a manner known to those of skill in the art) to act under the control of a control unit 500 (which per se may be a distinct element from the circuit 100 and the device 10) in order to apply the voltage drop between the input nodes 102a, 102b to the sensing nodes I and II. This may occur either with the same polarity (that is, with the same sign) as exemplified in FIG. 2, or with a reversed polarity (that is with an opposed or reversed sign) as exemplified in FIG. 3.

Stated otherwise, the voltage reversal switch arrangement SW1 illustrated herein is switchable (under the control of the unit 500) between:

a first state (FIG. 2) where the node iota is coupled to the node I and the node 102b is coupled to the node II, and a second state (FIG. 3) where the node iota is coupled to the node II and the node 102b is coupled to the node I.

As exemplified herein—this applies to both FIGS. 2 and 3—a (first) current flow line extends from the node I to ground GND through:

a current generator Ib1, the current path through a first transistor M1 (that is the source-drain current path in the case of a field-effect transistor such as a mosfet transistor as exemplified herein), and a current generator Ib3.

Similarly, as exemplified herein—this again applies to both FIGS. 2 and 3—a (second first) current flow line extends from the node II to ground GND through:

a current generator Ib2, the current path through a second transistor M2 (that is the source-drain current path in the case of a field-effect transistor such as a mosfet transistor as exemplified herein), and a current generator Ib4.

A resistor $R_x$ is coupled between the two current flow lines discussed previously at the nodes III and IV between the current generators Ib1, Ib2 and the transistors M1, M2, with the control electrodes (gates, in the case of field-effect transistors) of M1, M2 coupled to the current flow paths through two transistors Q1 and Q2 (the emitter-collector current flow path in the case of bipolar transistor as exemplified herein).

More specifically, in the illustrative embodiments of FIGS. 2 and 3:

the control electrode (gate) of M1 is coupled to the (emitter-collector) current path through Q1 at a node V locates at the side of Q1 opposite to the node I with a current generator Ib5 intermediate the node V and ground GND, and the control electrode (gate) of M2 is coupled to the (emitter-collector) current path through Q2 at a node VI located at the side of Q2 opposite to the node II with a current generator Ib6 intermediate the node VI and ground GND.

Two further nodes, designated VII and VIII, intermediate the transistor M2 and the current generator Ib4 and intermediate the transistor M1 and the current generator Ib3 are coupled via a current reversal switch arrangement SW2 to two nodes A and B, providing a (differential) output current towards a sub-stage 106 to be discussed in the following.

Again, the switch arrangement SW2 can be configured (in a manner known to those of skill in the art) to act under the control of the control unit 500 in such a way to deliver the current of the nodes VII and VIII to the nodes A and B either with the same polarity (that is, with the same direction of flow) as exemplified in FIG. 2, or with a reversed polarity (that is with an opposed direction of flow) as exemplified in FIG. 3.

Stated otherwise, the current reversal switch arrangement SW2 illustrated herein is switchable (under the control of the unit 500) between:

a first state (FIG. 2) where the node VII is coupled to the node A and the node VIII is coupled to the node B, and a second state (FIG. 3) where the node VII is coupled to the node B and the node VIII is coupled to the node A.

In one or more embodiments as exemplified in FIGS. 2 and 3, the transistors Q1 and Q2 (bipolar transistors in the exemplary embodiment considered herein) have applied to their control terminals (bases) a differential voltage which is equal to the voltage $V_{in}$ corresponding to the voltage drop across the shunt resistor $R_S$, which causes a current Ix equal to $V_{in}/Rx$ to flow through the resistor Rx.

Applying Kirchoff's law to the circuit mesh including the current generators Ib1, Ib2, Ib3, Ib4, the resistor Rx and the two (high-voltage) transistors M1, M2, one observes that a (differential) current equal to the current flowing through Rx will flow at the nodes A and B.

The current generators Ib1, Ib2, Ib3, Ib4 (and Ib5 and Ib6 as well) can be implemented in any manner known to those of skill in the art.

In one or more embodiments, the current generators Ib1, Ib2, Ib3, Ib4 provide a same current, selected to be negligible with respect to the current flowing through $R_S$ (so that measurement will not be altered appreciably), while higher than the maximum current expected though Rx. For instance, with a ratio between Rs and Rx equal to 500 k, the current selected may be, say, 1/100k the maximum current expected through Rs.

In one or more embodiments the currents provided by Ib5 and Ib6 may be of equal intensity, selected in such a way to be negligible with respect to the current though Rs and high enough to keep the transistors Q1 e Q2 in a good operating region.

It is observed that, thanks to the presence of the two (high-voltage) transistors M1 and M2, the common-mode voltage at the nodes A and B can be transposed into in the low-voltage domain via the sub-stage 106.

As exemplified herein, the sub-stage 106 may receive at an input 106a the differential current (equal to $V_{in}/Rx$) from the nodes A and B. As exemplified herein, this may occur via a low-pass RC network including an input resistor R3 coupled in parallel with a capacitor C1.

In one or more embodiments, the sub-stage 106 may be constructed around an operational amplifier (Op-Amp) 108 in a fully differential configuration that is with a pair of input nodes 108a, 108b and a pair of output nodes 108c, 108d.

In one or more embodiments, the operational amplifier (Op-Amp) 108 may be configured with feedback loops comprising:

inner RC (low-pass) loops comprising capacitors C2 coupling the input 108a with the output 108c and the input 108b with the output 108d and resistors R1 between the nodes A and B and the inputs 108a and 108b, respectively, outer feedback loops from the outputs 108c, 108d and the nodes A and B respectively, these latter nodes having the parallel connection of the resistor R3 and the capacitor C1, coupled therebetween.

In one or more embodiments, the Op-Amp 108 may be of the (otherwise conventional) "chopped" type.

Assuming a current having a value $V_{in}/Rx$ is injected/drained via the nodes A and B the sub-stage 106 transforms such a current into a differential output voltage $V^d_{OUT}$ between the output nodes 104a, 104b which can be expressed as:

$$V^d_{OUT} = V^+_{OUT} - V^-_{OUT} = 2\frac{R_S}{R_x}\frac{R_2}{1 + C_2\left(R_1 + R_2 + 2\frac{R_1 R_2}{R_3}\right)s + 2C_1 C_2 R_1 R_2 s^2} I_{INV}$$

where $V^+_{OUT}$ and $V^-_{OUT}$ are the voltages at the nodes 104a and 104b, respectively.

The transfer function linking $V^d_{OUT}$ to $I_{INV}$ is of the low-pass type (second order) with a low-frequency gain ($A_o$ in FIG. 1) determined by the ratio R2/Rx.

It is noted that the transfer function as defined above also includes the shunt resistor $R_S$, with a DC gain equal to $2*R_S*R2/Rx$. This includes the portion $2*R2/Rx$ which corresponds to the gain denoted $A_o$ in FIG. 1, representing the (voltage) gain of the stage 100 (without considering the shunt resistor $R_S$).

As noted, achieving low-offset and low-noise performance is a desirable feature of a stage such as 100.

In one or more embodiments as exemplified herein, such a result can be pursued by means of the switch arrangements SW1 and SW2 which (under the control of the unit 500) may periodically and synchronously switch between the configuration of FIG. 2 and the configuration of FIG. 3. In that way, the polarity of the (differential) input signal $V_{in}$ applied between the nodes I and II as well as the polarity (flow direction) of the (differential) current at the nodes A and B are periodically reversed synchronously with each other.

Such reversal of polarisation has no effect on the "useful" signal in so far as both of the polarity of the input voltage $V_{IN}$ applied between the nodes I and II and the polarity (flow direction) of the output current at the output nodes A and B are reversed synchronously.

Conversely, the low-frequency signals generated in the circuitry between the switch arrangements SW1, SW2—essentially offset and flicker noise—are subject (only) to the reversal action of the switch arrangements SW2.

Such a periodical polarity reversal provides an upward frequency shift of those signals generated in the circuitry between the switches SW1, SW2 other than the useful signal generated by the shunt resistor $R_S$.

Essentially, the periodical polarity reversal at SW2 can be regarded as a sort of modulation of offset and flicker noise via a square wave signal which results in a frequency shift towards a frequency $f_{sw}=1/T_{SW}$ where $T_{sw}$ is the period of the square wave (rectangular wave) signal corresponding to the periodical polarity reversal. Such frequency can thus be selected in a coordinated manner with the cut-off or corner frequency of the low-pass filtering action implemented in the sub-stage 106 in such a way that the frequency-shifted offset and flicker noise signals are filtered out as a result of such a low-pass filtering action.

For instance, in one or more embodiments, the switches SW1, SW2, can be switched with a frequency of 100 kHz, with the corner or cut-off frequency of the low-pass filter implemented by the sub-stage 106 set at 20 kHz.

In case an analogue-to-digital converter is provided as exemplified by 400 in FIG. 1, the respective sampling frequency $f_s$ can be set at 2 MHz, for instance.

As discussed, one or more embodiments may take into account the fact that the components in the sub-stage 106 may be the source of offset and low-frequency electronic noise. For that reason, using a "chopped type" Op-Amp chopped at a frequency of 100 kHz can be suggested for the fully differential amplifier 108. A chopped Op-Amp is a well-known circuit in the art, which makes it unnecessary to provide a more detailed description herein.

One or more embodiments as exemplified herein provide an input stage 100 including a fully differential amplifier (108, for instance) the stage being configured to have a high voltage (HV) input and a low-voltage (LV) output with offset and flicker noise cancelled, for instance, via a second order low-pass transfer function as discussed previously.

A stage 100 as exemplified in FIGS. 2 and 3 facilitates the provision of a device 10 as exemplified in FIG. 1 with the stages 200 and 300 taking benefit of the presence of the stage 100. This in turn facilitates removing the dependency of accuracy of the output voltage $V_{OUT}$ on the accuracy of the shunt resistor $R_S$, while preserving the advantages related to using a shunt resistor as the sensor element.

In one or more embodiments as exemplified herein, the transistors M1 ed M2 are optionally mosfet (that is field-effect) transistors, which are capable of withstanding a high voltage drop between source and drain: while this feature is mostly associated with field-effect transistors such as mosfet transistors, one or more embodiments may adopt for M1 and M2 bipolar transistors of a voltage class compatible with embodiments as exemplified herein.

Similarly, while exemplified herein as bipolar transistors, Q1 e Q2 can be either bipolar or field-effect (MOSFET, for instance) transistors. Bipolar transistors are exemplified herein insofar as these may provide a reduced offset contribution.

A circuit (for instance, 100) as exemplified herein may comprise:

a differential input (for instance, 102) comprising a pair of input nodes (for instance, 102a, 102b) configured to have coupled therebetween a sensing resistor (for instance, $R_S$) traversed by a current (for instance, $I_{INV}$), wherein the input nodes are configured to have an input voltage applied therebetween (for instance, $V_{in}=I_{INV}*R_S$, thus a function of $I_{INV}$ via $R_S$), a first voltage sensing node (for instance, I) and a second voltage sensing node (for instance, II), a voltage reversal switch arrangement (for instance, SW1) intermediate the input nodes in the differential input and the first and second voltage sensing nodes, the voltage reversal switch arrangement switchable (for instance, under the control of 500) between a first voltage switch state and a second voltage switch state wherein the input voltage between the input nodes in the differential input is applied between the first and second voltage sensing nodes with a first voltage polarity in the first voltage switch state and with a second voltage polarity, opposite the first voltage polarity, in the second voltage switch state, a first current flow line (for instance, Ib1, M1, Ib3) between the first voltage sensing node and ground (for instance, GND) and a second current flow line (for instance, Ib2, M2, Ib4) between the second voltage sensing node and ground, a difference resistor (for instance, Rx) intermediate the first current flow line and the second current flow line, wherein the difference resistor is traversed by a current which is a function of the input voltage as applied to the first and second sensing nodes via the voltage reversal switch arrangement, a first current sensing node (for instance, VII) at the second current flow line and a second current sensing node (for instance, VIII) at the first current flow line, wherein the first and second current flow lines have coupled therewith a respective transistor (for instance, Q1 for the first current flow line and Q2 for the second current flow line) having a control terminal (for instance, base in the case of a bipolar transistor) coupled to the difference resistor and the current flow path therethrough (for instance, emitter-collector in the case of a bipolar transistor) coupled intermediate a respective one of the voltage sensing nodes and a respective current generator (for instance, Ib5 for the first current flow line and Ib6 for the second current flow line) intermediate the respective transistor and ground, wherein a current which is a function of the current through the difference resistor is sensed at the first and the second sensing nodes, a differential current output comprising a pair of output nodes (for instance, A, B) configured to deliver an output current, a current reversal switch arrangement (for instance, SW2) intermediate the first and second current sensing nodes and the output nodes in the differential current output, the current reversal switch arrangement switchable (for instance, under the control of 500) between a first current switch state and a second current switch state wherein the current sensed at the first and the second sensing nodes is transferred to the output nodes in the differential current output with a first current polarity (direction of flow) in the first current switch state and with a second current polarity, opposite the first polarity, in the second current switch state, wherein the voltage reversal switch arrangement and the current reversal switch arrangement are switchable synchronously (for instance, under the control of 500) to deliver at the output nodes in the differential current output a current with a constant (that is, steady, not changing in sign or sense) direction of flow, wherein the current at the output nodes (A, B) in the differential current output is a function of the current (for instance, $I_{INV}$) traversing (that is, flowing through) the sensing resistor (for instance $R_S$).

In fact, in one or more embodiments, the input voltage reversal at SW1, which would per se produce a reversal of the direction of flow of the output current, may be compensated by the (synchronous) output reversal at SW2.

In a circuit as exemplified herein, the first current flow line and the second current flow line may (each) comprise:

a respective first current generator (for instance, Ib1 for the first current flow line and Ib2 for the second current flow line) intermediate a respective one of the voltage sensing nodes and the difference resistor intermediate the first and second current flow lines, a respective further transistor (for instance, M1 for the first current flow line and M2 for the second current flow line) arranged with the current flow path therethrough (for instance, source-drain in the case of field-effect transistor) intermediate the difference resistor and a respective one of the current sensing nodes, a respective second current generator (for instance, Ib3 for the first current flow line and Ib4 for the second current flow line) intermediate a respective one of the current sensing nodes and ground.

In a circuit as exemplified herein, the respective further transistor may comprises a field-effect transistor arranged with the source-drain current flow path therethrough intermediate the difference resistor and a respective one of the current sensing nodes.

In a circuit as exemplified herein the respective transistor (for instance, Q1 for the first current flow line and Q2 for the second current flow line) having a control terminal coupled to the difference resistor has the current flow path therethrough (for instance, emitter-collector in the case of a bipolar transistor) coupled intermediate a respective one of the voltage sensing nodes and a control terminal of the respective further transistor (for instance, M1 for the first current flow line and M2 for the second current flow line) arranged with the current flow path therethrough (for instance, source-drain in the case of a field-effect transistor) intermediate the difference resistor and a respective one of the current sensing nodes, and the respective current generator (for instance, Ib5 for the first current flow line and Ib6 for the second current flow line) intermediate the control terminal (for instance, gate, in the case of a field-effect transistor) of the respective transistor and ground.

In a circuit as exemplified herein the respective transistor (for instance, Q1 for the first current flow line and Q2 for the second current flow line) may comprise a bipolar transistor having the base terminal coupled to the difference resistor and the emitter-collector current flow path therethrough coupled intermediate a respective one of the voltage sensing nodes and a control terminal (for instance, gate, in the case of a field-effect transistor) of the respective further transistor (for instance, M1 in the first current flow line and M2 in the second current flow line, respectively).

A circuit as exemplified herein may comprise a differential amplifier (for instance, 108), optionally a chopped operational amplifier, having a differential input (for instance, 108a, 108b) coupled to the differential output comprising a pair of output nodes (for instance, A, B).

In a circuit as exemplified herein, the differential amplifier may comprise a fully differential operational amplifier providing a differential output signal (for instance, $V^d$out) at the amplifier output (for instance, 104a, 104b), In a circuit as exemplified herein, the differential amplifier may be coupled to at least one low-pass filter circuit (for instance, R3, C1; R1, R2, C2) to provide a low-pass filtered output signal (for instance, $V^d$out) at the amplifier output, the at least one low-pass filter circuit optionally comprising a RC low-pass network selected out of:

a parallel arrangement of a resistor (for instance, R3) and a capacitor (for instance, C1) coupled across (via the resistors R1, for instance) of the differential input of the differential amplifier, a feedback network (R1, R2, C2) of the differential amplifier comprising a capacitor (for instance, C2) intermediate an output (for instance, 108c and 108d, respectively) and an input (for instance, 108a and 108b, respectively) of the differential amplifier.

A device (for instance, 10) as exemplified herein may comprise:

input circuitry comprising a circuit (optionally a circuit 100 as exemplified herein) comprising a pair of input nodes configured to have coupled therebetween a sensing resistor traversed by a current as well as a differential voltage output comprising a pair of output nodes, the circuit configured (see, for instance, the sub-stage 106 including the OpAmp 108) to provide at the differential voltage output (for instance, 104) comprising a pair of output nodes (for instance, 104a, 104b) a differential voltage output signal (for instance, $V^d$out) which is a function of a differential voltage output signal ($V^d$out) which is a function of (the in the intensity of) the current ($I_{INV}$) traversing the sensing resistor ($R_S$), voltage-to-current converter circuitry (for instance, 200) coupled to the output nodes (for instance, 104a, 104b) in the differential voltage output (for instance, 104) of the input circuitry, the voltage-to-current converter circuitry comprising a current mirror configured (thanks to the resistor $R_{Vtoi}$, for instance) to convert a differential voltage output signal from the input circuitry into a differential current (for instance, I, 204) which is a function of (the intensity of) the current (for instance, $I_{INV}$) traversing the sensing resistor (for instance, $R_S$), and current-to-voltage converter circuitry (for instance, 300) coupled to the voltage-to-current converter circuitry and configured to be supplied (for instance, at 302) with the differential current therefrom, the current-to-voltage converter circuitry comprising a charge capacitor (for instance, C) alternately charged and discharged with capacitor charge times ($NT_{CK}$, for instance) determined by a charge clock (for instance, $T_{CK}$), wherein during the charge times the charge capacitor (for instance, C) is charged with the differential current (I, 204) from the voltage-to-current converter circuitry, wherein the voltage (for instance, $V_{OUT}$) across the charge capacitor (for instance, C) is a function of (the intensity of) the current (for instance, $I_{INV}$) traversing the sensing resistor (for instance, $R_S$).

A device as exemplified herein may comprise analog-to-digital circuitry (for instance, 400) configured to convert to digital the voltage (for instance, $V_{OUT}$) across the charge capacitor (C).

A device as exemplified herein (for instance, 100, 200, 300, 400) may integrate to a single integrated circuit together with the sensing resistor (for instance, $R_S$).

A method of operating a circuit (for instance, 100) or a device (for instance, 10) as exemplified herein may comprise switching (for instance, under the control of 500) the voltage reversal switch arrangement (for instance, SW1) synchronously with the current reversal switch arrangement (for instance, SW2).

The details and embodiments may vary, even significantly, with respect to what has been described by way of example only without departing from the extent of protection.

The extent of protection is determined by the annexed claims.

What is claimed is:
1. A circuit, comprising:
   a differential input comprising a pair of input nodes configured to have coupled therebetween a sensing resistor traversed by a current, wherein the input nodes are configured to have an input voltage applied therebetween;
   a first voltage sensing node and a second voltage sensing node;
   a voltage reversal switch arrangement intermediate the input nodes in the differential input and the first and second voltage sensing nodes, the voltage reversal switch arrangement switchable between a first voltage switch state and a second voltage switch state wherein the input voltage between the input nodes in the differential input is applied between the first and second voltage sensing nodes with a first voltage polarity in the first voltage switch state and with a second voltage polarity, opposite the first voltage polarity, in the second voltage switch state;

a first current flow line between the first voltage sensing node and ground and a second current flow line between the second voltage sensing node and ground;

a difference resistor intermediate the first current flow line and the second current flow line, wherein the difference resistor is traversed by a current which is a function of the input voltage as applied to the first and second voltage sensing nodes via the voltage reversal switch arrangement;

a first current sensing node at the second current flow line and a second current sensing node at the first current flow line, wherein the first and second current flow lines have coupled therewith a respective transistor having a control terminal coupled to the difference resistor and a current flow path therethrough coupled intermediate a respective one of the voltage sensing nodes and a respective current generator intermediate the respective transistor and ground, wherein a current which is a function of the current through the difference resistor is sensed at the first and the second voltage sensing nodes;

a differential current output comprising a pair of output nodes configured to deliver an output current; and a current reversal switch arrangement intermediate the first and second current sensing nodes and the output nodes in the differential current output, the current reversal switch arrangement switchable between a first current switch state and a second current switch state wherein the current sensed at the first and the second voltage sensing nodes is transferred to the output nodes in the differential current output with a first current polarity in the first current switch state and with a second current polarity, opposite the first current polarity, in the second current switch state;

wherein the voltage reversal switch arrangement and the current reversal switch arrangement are synchronously switchable to deliver at the output nodes in the differential current output a current with a constant direction of flow, wherein the current at the output nodes in the differential current output is a function of the current traversing the sensing resistor.

2. The circuit of claim 1, wherein each of the first current flow line and the second current flow line comprise:

a respective first current generator intermediate a respective one of the voltage sensing nodes and the difference resistor intermediate the first and second current flow lines;

a respective further transistor arranged with a current flow path therethrough intermediate the difference resistor and a respective one of the current sensing nodes; and a respective second current generator intermediate a respective one of the current sensing nodes and ground.

3. The circuit of claim 2, wherein the respective further transistor comprises a field-effect transistor arranged with a source-drain current flow path therethrough intermediate the difference resistor and a respective one of the current sensing nodes.

4. The circuit of claim 2, wherein:

the respective transistor having the control terminal coupled to the difference resistor has the current flow path therethrough coupled intermediate the respective one of the voltage sensing nodes and a control terminal of the respective further transistor arranged with a current flow path therethrough intermediate the difference resistor and a respective one of the current sensing nodes; and the respective current generator intermediate the control terminal of the respective transistor and ground.

5. The circuit of claim 4, wherein the respective transistor comprises a bipolar transistor having a base terminal coupled to the difference resistor and an emitter-collector current flow path therethrough coupled intermediate a respective one of the voltage sensing nodes and the control terminal of the respective further transistor.

6. The circuit of claim 1, comprising a differential amplifier having a differential input coupled to the differential current output comprising the pair of output nodes.

7. The circuit of claim 6, wherein the differential amplifier is a chopped operational amplifier.

8. The circuit of claim 6, wherein the differential amplifier comprises a fully differential operational amplifier providing a differential output signal at an output of the differential amplifier.

9. The circuit of claim 6, wherein the differential amplifier is coupled to at least one low-pass filter circuit to provide a low-pass filtered output signal at an output of the differential amplifier.

10. The circuit of claim 9, wherein the at least one low-pass filter circuit comprises a RC low-pass network selected out of a parallel arrangement of a resistor and capacitor coupled across the differential input of the differential amplifier and a feedback network of the differential amplifier comprising a capacitor intermediate the output and an input of the differential amplifier.

11. A device, comprising:

input circuitry comprising a differential input comprising a pair of input nodes configured to have coupled therebetween a sensing resistor traversed by a current as well as a differential voltage output comprising a pair of output nodes, the input circuitry configured to provide at the differential voltage output comprising the pair of output nodes a differential voltage output signal which is a function of the current traversing the sensing resistor;

voltage-to-current converter circuitry coupled to the output nodes in the differential voltage output of the input circuitry, the voltage-to-current converter circuitry comprising a current mirror configured to convert the differential voltage output signal from the input circuitry into a differential current which is a function of the current traversing the sensing resistor; and current-to-voltage converter circuitry coupled to the voltage-to-current converter circuitry and configured to be supplied with the differential current therefrom, the current-to-voltage converter circuitry comprising a charge capacitor alternately charged and discharged with capacitor charge times determined by a charge clock, wherein during the charge times the charge capacitor is charged with the differential current from the voltage-to-current converter circuitry, wherein a voltage across the charge capacitor is a function of the current traversing the sensing resistor.

12. The device of claim 11, comprising analog-to-digital circuitry configured to convert to digital the voltage across the charge capacitor.

13. The device of claim 11, wherein the device and the sensing resistor are integrated into a single integrated circuit.

14. A method of operating a circuit, the method comprising:

applying an input voltage between a pair of input nodes of a differential input;

sensing a current traversing a sensing resistor coupled between the pair of input nodes;

switching a voltage reversal switch arrangement, disposed intermediate the input nodes in the differential input and first and second voltage sensing nodes, synchronously with a current reversal switch arrangement, disposed intermediate first and second current sensing nodes and output nodes in a differential current output, to deliver, a current at the output nodes of the differential current output, having a constant direction of flow and being a function of the current traversing the sensing resistor;

the voltage reversal switch arrangement being switchable between a first voltage switch state and a second voltage switch state, the input voltage between the input nodes in the differential input being applied between the first and second voltage sensing nodes with a first voltage polarity in the first voltage switch state and with a second voltage polarity, opposite the first voltage polarity, in the second voltage switch state;

the current reversal switch arrangement being switchable between a first current switch state and a second current switch state, the current sensed at the first and the second voltage sensing nodes being transferred to the output nodes in the differential current output with a first current polarity in the first current switch state, and with a second current polarity, opposite the first current polarity, in the second current switch state;

traversing a difference resistor, intermediate a first current flow line between the first voltage sensing node and ground, and a second current flow line between the second voltage sensing node and ground, with a current which is a function of the input voltage as applied to the first and second voltage sensing nodes via the voltage reversal switch arrangement; and sensing a current, which is a function of the current through the difference resistor, at the first and the second voltage sensing nodes, the first current sensing node at the second current flow line and the second current sensing node at the first current flow line having coupled therewith a respective transistor having a control terminal coupled to the difference resistor and a current flow path therethrough coupled intermediate a respective one of the voltage sensing nodes and a respective current generator intermediate the respective transistor and ground.

15. The method of claim 14, further comprising controlling, by a control unit, switching of the voltage reversal switch arrangement between the first voltage switch state and the second voltage switch state.

16. The method of claim 15, further comprising controlling, by the control unit, switching of the current reversal switch arrangement between the first current switch state and the second current switch state.

17. The method of claim 14, further comprising controlling, by a control unit, the synchronous switching of the voltage reversal switch arrangement and the current reversal switch arrangement.

18. The method of claim 14, further comprising receiving, by a first differential input of a differential amplifier, an output of the differential current output comprising the pair of output nodes.

19. The method of claim 18, further comprising providing, by a fully differential operational amplifier of the differential amplifier, a differential output signal at an output of the differential amplifier.

20. The method of claim 18, further comprising providing, by a low-pass filter circuit coupled to the differential amplifier, a low-pass filtered output signal at an output of the differential amplifier.

* * * * *